(12) United States Patent
Gourvest et al.

(10) Patent No.: US 10,522,593 B2
(45) Date of Patent: Dec. 31, 2019

(54) PHASE-CHANGE MEMORY CELL

(71) Applicant: STMicroelectronics (Crolles 2) SAS, Crolles (FR)

(72) Inventors: Emmanuel Gourvest, Voiron (FR); Yannick Le Friec, Le Cheylas (FR); Laurent Favennec, Villard Bonnot (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/117,947

(22) Filed: Aug. 30, 2018

(65) Prior Publication Data

US 2018/0374898 A1    Dec. 27, 2018

Related U.S. Application Data

(62) Division of application No. 15/452,940, filed on Mar. 8, 2017, now abandoned.

(30) Foreign Application Priority Data

Sep. 28, 2016  (FR) ..................... 16 59175

(51) Int. Cl.
*H01L 27/24* (2006.01)
*H01L 45/00* (2006.01)

(52) U.S. Cl.
CPC ...... *H01L 27/2436* (2013.01); *H01L 27/2472* (2013.01); *H01L 45/1206* (2013.01); *H01L 45/1226* (2013.01); *H01L 45/1683* (2013.01); *H01L 45/06* (2013.01); *H01L 45/126* (2013.01); *H01L 45/1233* (2013.01); *H01L 45/144* (2013.01); *H01L 45/16* (2013.01)

(58) Field of Classification Search
CPC ............ H01L 27/2436; H01L 45/1226; H01L 45/126
See application file for complete search history.

(56) References Cited

U.S. PATENT DOCUMENTS

| 6,849,892 | B2 | 2/2005 | Hideki |
| 7,422,926 | B2 | 9/2008 | Pellizzer et al. |
| 7,498,601 | B2 | 3/2009 | Hayakawa et al. |
| 7,608,850 | B2 | 10/2009 | Chang |
| 7,910,907 | B2 | 3/2011 | Lung |
| 7,989,251 | B2 | 8/2011 | Nejad |
| 2006/0202245 | A1 | 9/2006 | Zuliani et al. |
| 2009/0017577 | A1 | 1/2009 | An et al. |

FOREIGN PATENT DOCUMENTS

EP    1684352 A1    7/2006

OTHER PUBLICATIONS

INPI Search Report and Written Opinion for FR 1659175 dated Jun. 12, 2017 (7 pages).

*Primary Examiner* — Allison Bernstein
(74) *Attorney, Agent, or Firm* — Crowe & Dunlevy

(57) ABSTRACT

Two phase-change memory cells are formed from a first conductive via, a second conductive and a central conductive via positioned between the first and second conductive vias where a layer of phase-change material is electrically connected to the first and second conductive vias by corresponding resistive elements and insulated from the central conductive via by an insulating layer. The conductive vias each include a lower portion made of a first metal (such as tungsten) and an upper portion made of a second metal (such as copper). Drains of two transistors are coupled to the first and second conductive vias while sources of those two transistors are coupled to the central conductive via.

10 Claims, 5 Drawing Sheets

PHASE-CHANGE MEMORY CELL

CROSS REFERENCE TO RELATED APPLICATIONS

This application is a divisional of U.S. application for patent Ser. No. 15/452,940 filed Mar. 8, 2017 (now abandoned), which claims the priority benefit of French Application for Patent No. 1659175, filed on Sep. 28, 2016, the disclosures of which are hereby incorporated by reference in their entireties.

TECHNICAL FIELD

The present disclosure relates to an electronic circuit, and more particularly to a phase-change memory (PCM) cell.

BACKGROUND

Phase-change materials may switch, under the effect of heat, between a crystalline phase and an amorphous phase. Since the electric resistance of an amorphous material is significantly greater than the electric resistance of a crystalline material, it is possible to determine the phase of the material by measuring the resistance thereof. This enables the storage of a binary piece of information, which depends on the state of the phase-change material.

FIG. 1, which corresponds to FIG. 13 of U.S. Pat. No. 7,422,926 (corresponding to European Patent Application EP 1729355), incorporated by reference, is a cross-section view of two neighboring PCM cells. Two conductive vias 2 and 4, bordered with a conductive barrier layer 5, cross a dielectric layer 6. Each of the two vias is in contact with the emitter 7 of a transistor, not shown. The structure is covered with a silicon nitride layer 8 and then with a dielectric layer 10. Two cavities 11 are dug into dielectric layer 10 and into silicon nitride layer 8 to reach the top of vias 2 and 4. The inside of cavities 11 is covered with a thin layer of resistive material 12. Cavities 11 are then filled with a thin dielectric layer 14 and with a filling dielectric 16. The structure is covered with a silicon nitride layer 18 and with a bonding layer 19. The silicon nitride layer 18 and bonding layer 19 are etched to expose a portion 21 of the upper ring of resistive material above each via 2 or 4 but to leave a limited portion 20 of the upper ring of resistive material covered. The structure is covered with a phase-change material 22. Thus, at the level of each via, only a limited portion 21 of the upper ring of resistive material is in contact with the layer of phase-change material 22, so that a phase change can occur in an area 23 close to this limited portion 21.

To program such PCM cells, a current is conducted between vias 2 and 4, which corresponds to the memory cell to be programmed, and an electrode attached to the upper surface of layer 22. This current heats resistive material 12 and, by contact, area 23 up to a temperature greater than the phase-change temperature of material 22. Material 22 of area 23 changes phase and the memory is thus programmed.

As described in above-mentioned U.S. Pat. No. 7,422,926, in the case where the cell density increases, it is no longer possible to form a cavity 11 above each of vias 2 and 4. U.S. Pat. No. 7,422,926 then provides forming a single cavity for two memory cells instead of one per memory cell.

Such a device is illustrated in FIG. 2, which corresponds to FIG. 29 of U.S. Pat. No. 7,422,926. A dielectric layer 6 is crossed by two vias 2 and 4. The structure is covered with a silicon nitride layer 8 and with a dielectric layer 10. A cavity is dug into dielectric layer 10 and silicon nitride layer 8. The cavity extends laterally from via 2 to via 4, at least partially exposing the upper end of vias 2 and 4. The inside of the cavity is covered with a layer of resistive material 12 and with a dielectric layer 14. The materials of resistive material 12 and dielectric layer 14 located on the bottom of the cavity are, for example, removed by etching. The resulting cavity is filled with dielectric 16. The structure is covered with a phase-change material 22.

Thus, each lateral edge of the single cavity is covered with a resistive material which extends vertically between the via on which it is placed and an area 23 of phase-change material layer 22.

SUMMARY

The forming of a phase-change cell similar to that described in relation with FIG. 2, but where there exists an intermediate via between two vias topped with portions of a resistive material in contact with phase change material, is here considered.

Thus, an embodiment provides an assembly of two phase-change memory cells comprising: two first vias made of a first metal such as tungsten; a central via located between the two first vias, the lower portion of the central via being made of the first metal and its upper portion being made of a second material such as copper; a resistive element on each of the two first vias; and a layer of phase-change material in contact with tops of the resistive elements.

According to an embodiment, the central via has the shape of an elongated conductive strip.

According to an embodiment, all of the vias are formed of a lower portion made of the first metal and of an upper portion made of the second metal.

According to an embodiment, the assembly of two memory cells comprises two transistors, the drain of one of the transistors being in contact with the central via, the source of this transistor being in contact with the central via, the source of the other transistor being in contact with the central via, and the drain of this other transistor being in contact with the other first via.

According to an embodiment, memory cells of the plurality of cells are formed on either side of a common central via.

Another embodiment provides a memory comprising: a first electrode formed, on the layer of phase-change material, opposite each of the two first vias; and a second electrode in contact with the central via.

According to an embodiment, the phase-change material is an alloy comprising germanium, antimony, and tellurium.

Another embodiment provides a method of manufacturing a phase-change memory comprising the steps of: forming in a first dielectric parallel rows of first vias and central vias each formed of an elongated conductive strip between two rows of first vias parallel thereto, the first vias and the central vias being made of a first metal such as tungsten; removing the first metal from an upper portion of the vias; filling the upper portions of the vias with a second metal such as copper; forming a layer of a second dielectric on the structure; etching in the second dielectric cavities extending from one row of first vias to another, at least partially exposing the upper end of the first vias and exposing an upper end of the central via located between the two rows of the first vias; depositing a layer of resistive material over the entire structure; removing the resistive material, only leaving in place portions of the resistive material, each portion being in contact with the upper end of a first via and extending upwards on the edge of the cavity without protruding therefrom; filling the cavity with a third dielectric; and depositing a layer of phase-change material on the structure.

According to an embodiment, the method comprises the step of removing all the layers of materials above the first dielectric outside areas comprising a single via of each row and the portion of the central via located between the first two vias.

According to an embodiment, the method further comprises the step of depositing a conductive layer on the phase-change material.

According to an embodiment, the method further comprises the steps of: forming first electrodes in contact with the conductive layer opposite each first via; and forming second electrodes in contact with the central via.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
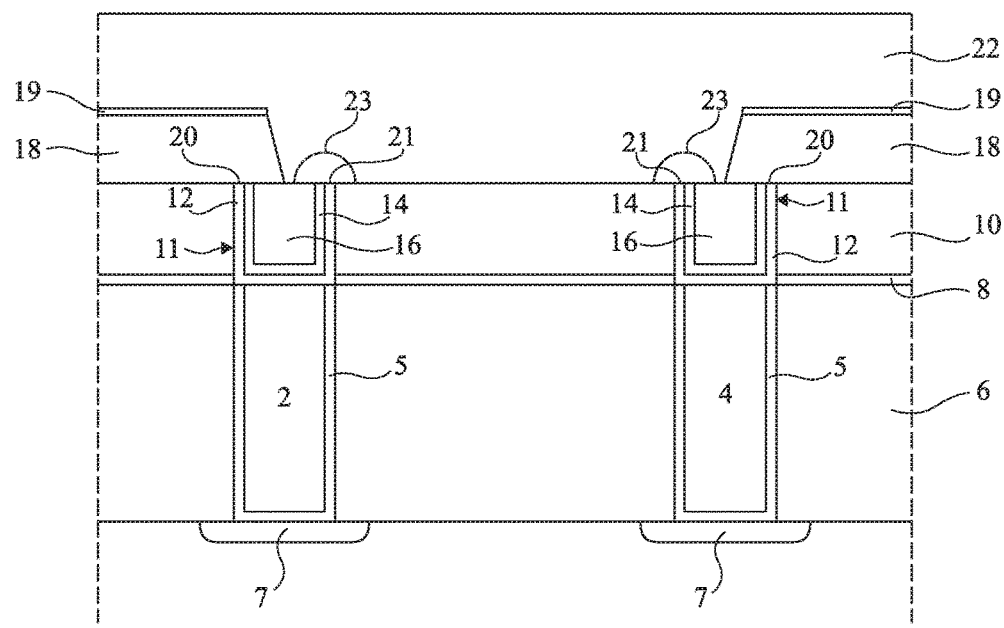
FIGS. 1 and 2, previously described, are cross-section views of two phase-change memory cells.
Figure 2:
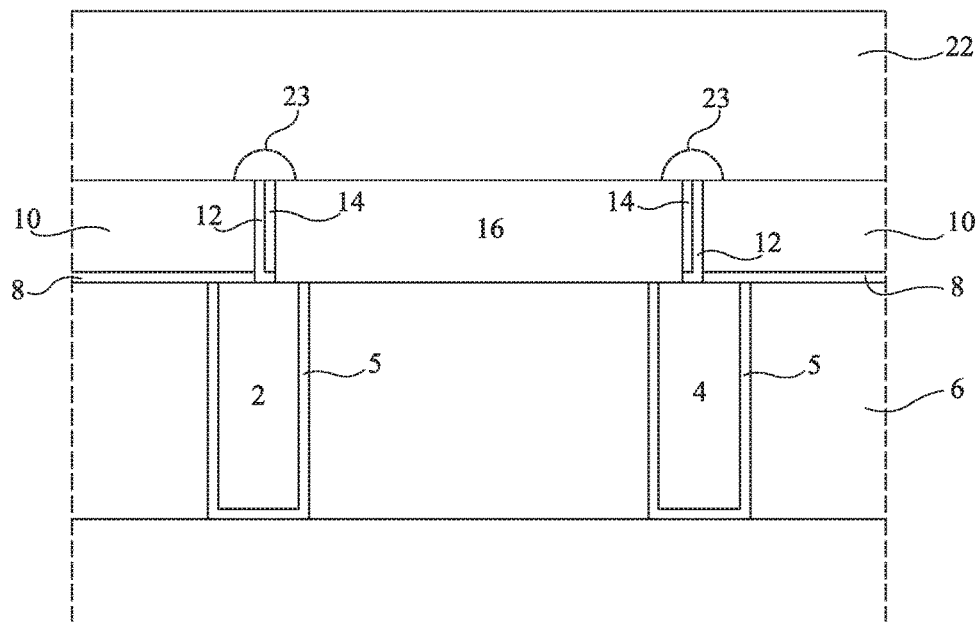

The same elements have been designated with the same reference numerals in the different drawings and, further, the various drawings are not to scale. For clarity, only those elements which are useful to the understanding of the described embodiments have been shown and detailed.

In the following description, when reference is made to terms qualifying the relative position, such as term "top", "upper", or "lower", etc., reference is made to the orientation of the considered elements in the drawings.

FIGS. 3A to 3F are cross-section views illustrating steps of the manufacturing of a phase-change memory (PCM). The described manufacturing steps may enable to simultaneously manufacture PCM cells and logic cells.

Figure 3A:
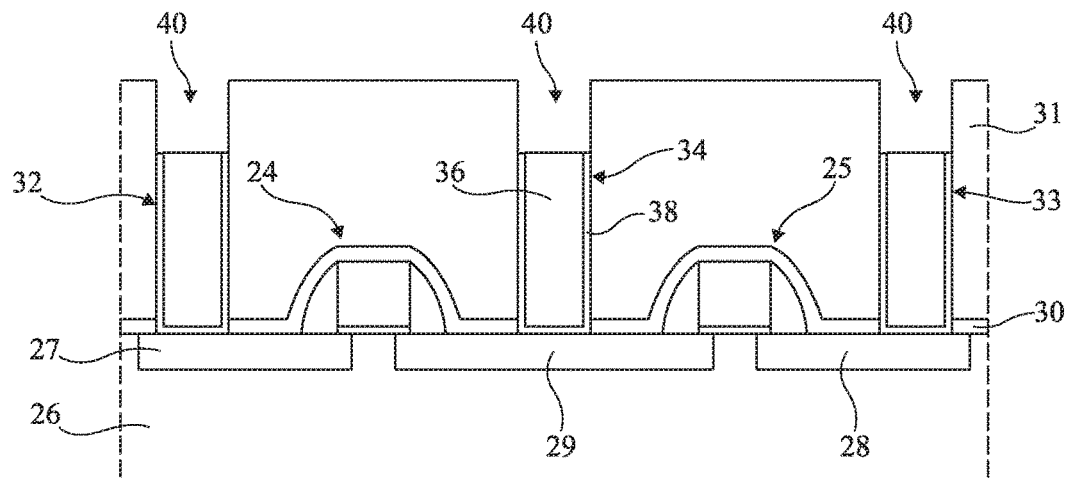
FIGS. 3A to 3F are cross-section views illustrating steps of the manufacturing of an embodiment of two phase-change cells.

At the step illustrated in FIG. 3A, two MOS transistors 24 and 25 are formed inside and on top of a semiconductor substrate layer 26. Transistor 25 has a source 29 and a drain 28. The area forming sources 29 thus forms a common source between transistors 24 and 25.

The structure is covered with a layer 30 of an etch stop dielectric, for example, silicon nitride, and then with a dielectric layer 31, for example, silicon oxide.

Vias 32, 33, and 34 cross layers 30 and 31 and respectively come into contact with drain/source areas 27, 28, and 29. Vias 32 and 33 have a cross-section which is circular, square, or intermediate between these two shapes. Via 34 is a central via which has the shape of an elongated conductive strip extending orthogonally to the plane of the drawing (i.e., parallel to the widths of the transistors and perpendicular to the lengths of the transistors).

Vias 32, 33, and 34 are made of a metal 36, such as tungsten. A titanium and/or titanium nitride layer 38 forms a bonding material. A cavity 40 has been dug into the upper portion of each of vias 32, 33, and 34 (removing an upper portion of the tungsten fill material and the bonding material).

Figure 3B:
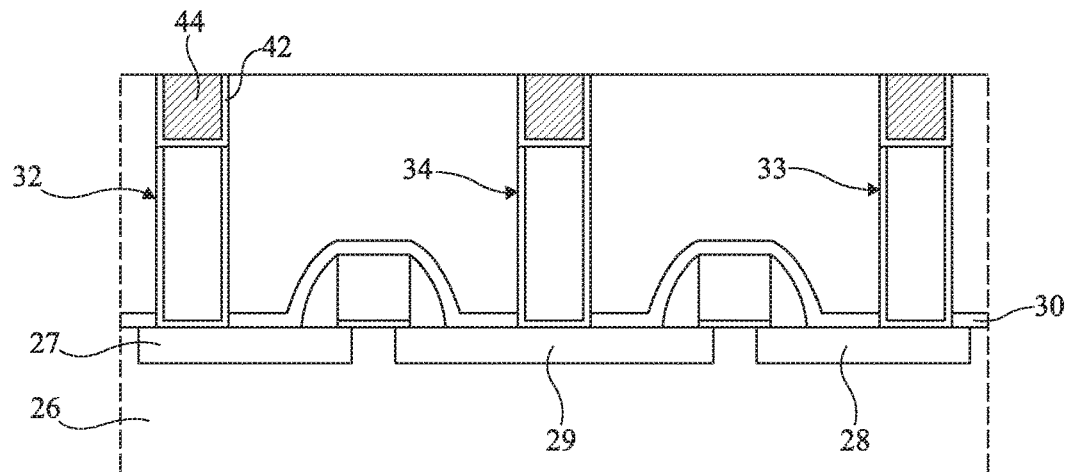

At the step illustrated in FIG. 3B, a thin conductive layer 42, such as a tantalum and/or tantalum nitride layer, is deposited on the structure and is then covered with a copper layer 44. Copper layer 44 is sufficiently thick for cavities 40 to be totally filled. The upper surface of the structure is uniformly polished to remove copper 44 and metal layer 42 located outside of cavities 40. Copper plugs 44 are thus formed.

Figure 3C:
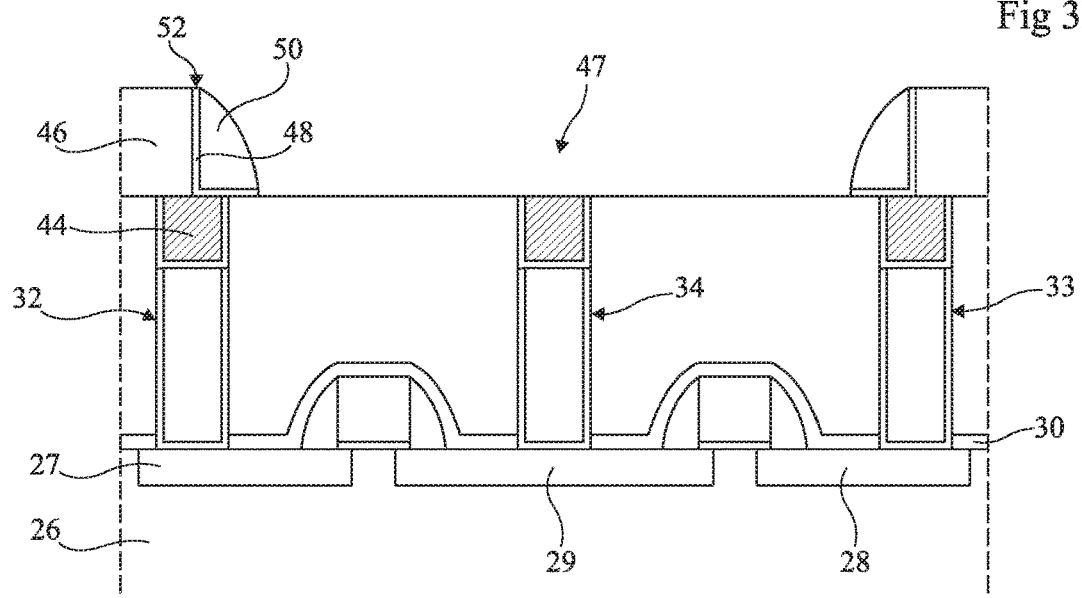

At the step illustrated in FIG. 3C, the structure is covered with a dielectric layer 46, for example, silicon nitride. Then, a cavity 47 is formed in dielectric layer 46, the cavity 47 extending from via 32 to via 33. Cavity 47 thus exposes the upper end of central via 34 (at its copper plug 44) and partially exposes the upper ends of vias 32 and 33 (at their copper plugs 44).

A resistive metal layer 48, for example, silicon and titanium nitride, and a dielectric layer 50 are deposited on the structure. Dielectric 50 is etched to form spacers along the edges of cavity 47, thus protecting portions of resistive material 48. The resistive material 48 which is not protected by the spacers is removed by wet chemical etching or by reactive plasma etching. The protected portions of resistive material 48 are L-shaped. The lower portions of the protected portions (formed by a first leg of the L-shape) are respectively in contact with metal plug 44 of vias 32 and 33. Reference 52 designates the top of upper portions of the protected portions (formed by a second leg of the L-shape extending perpendicular to the first leg) for the resistive metal layer 48.

Copper has been selected as the material for coating the upper portion of vias 32, 33, and 34 since usual chemical methods of (wet or plasma) etching resistive material 48 are highly selective over copper, that is, the copper etch speed is very low as compared with that of resistive material 48. On the contrary, such chemical processes are little selective over tungsten, that is, they etch tungsten at a speed close to that of resistive material 48, or even greater. As an example, a chemical method of etching by hydrogen bromide and dichloride in a reactive gaseous oxygen, nitrogen, argon, and/or helium medium at low temperature, for example, 50° C., or a chemical tetramethylammonium hydroxide etch method coupled with copper corrosion inhibitors and diluted in oxygenated water may be used. Thus, in the absence of copper plugs 44, the etching of resistive material 48 would cause the etching of tungsten and the forming of a parasitic cavity in the upper portion of via 34.

As a variation, during the step of forming cavities 40 illustrated in FIG. 3A, vias 32 and 33 may be masked, so that a cavity 40 is formed in via 34 only. The steps illustrated in FIGS. 3A and 3B would then result in the forming of a copper portion 44 above via 34.

Figure 3D:
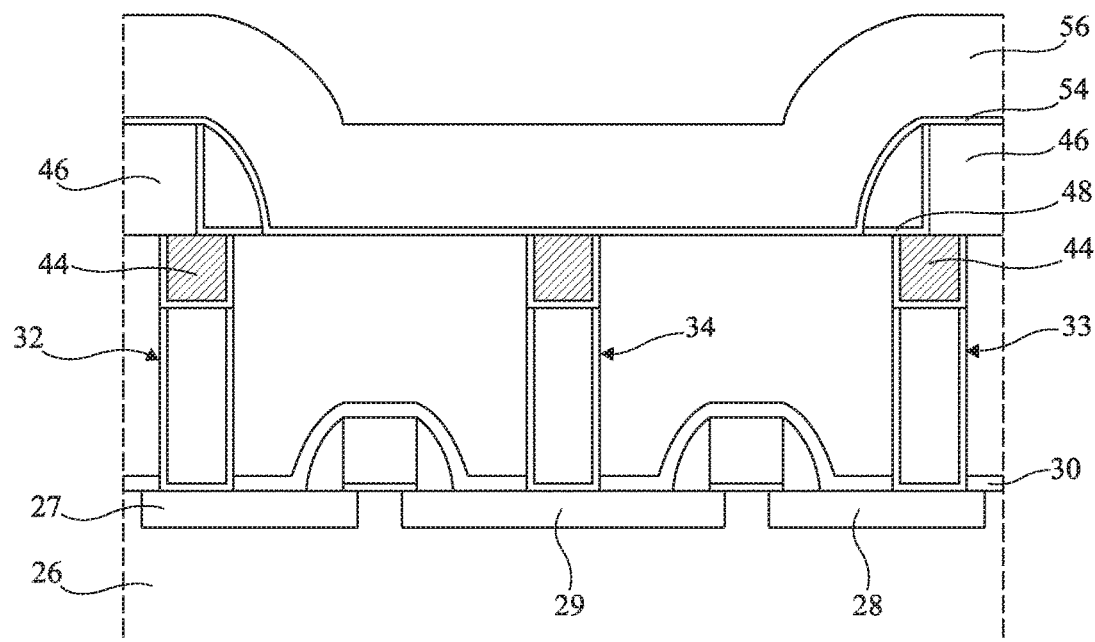

At the step illustrated in FIG. 3D, the structure is conformally covered with a dielectric layer 54, for example, silicon nitride, which is then conformally covered with a dielectric layer 56, for example, silicon oxide. Silicon nitride 54 has been selected not only to be subsequently used as an etch stop layer, but also to avoid the diffusion of copper in the silicon oxide. The thickness of dielectric layer 56 is sufficient for cavity 47 to be totally filled.

Figure 3E:
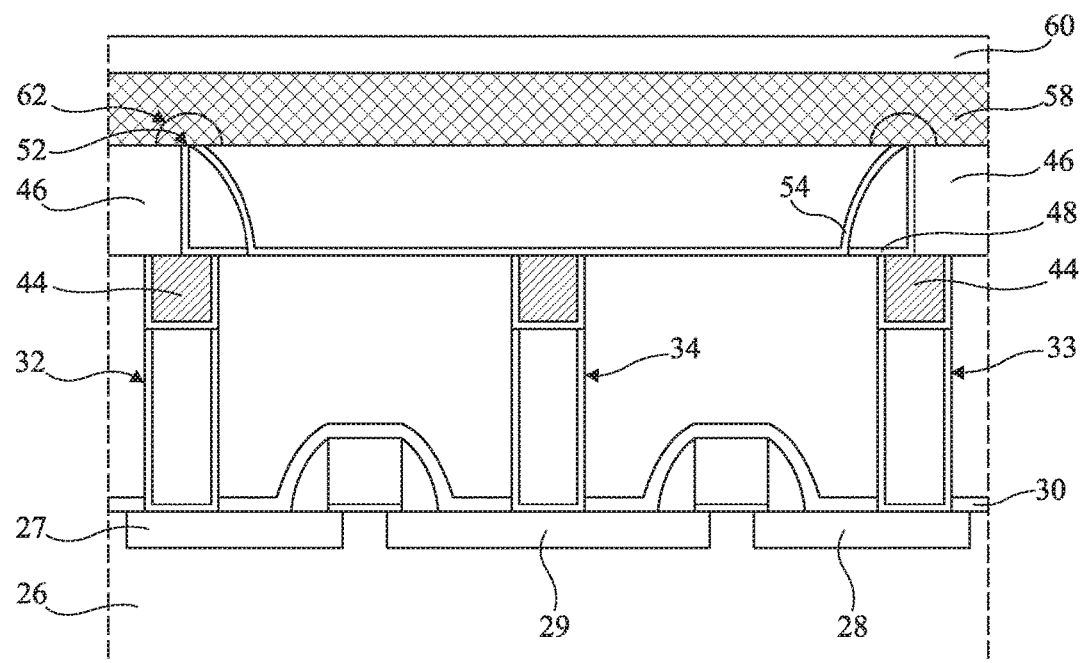

At the step illustrated in FIG. 3E, dielectric materials for layers 54 and 56 deposited outside of the cavity are removed from the entire structure, for example, by chemical mechanical polishing (CMP). The structure is covered with a layer of a phase-change material 58, such as an alloy comprising germanium, antimony, and tellurium, and with a conductive layer 60 forming an electrode. There thus is a contact between phase-change material 48 and tops 52 of the portions of resistive material 48. The phase change of material 58 is capable of occurring in areas 62 close to tops 52.

Figure 3F:
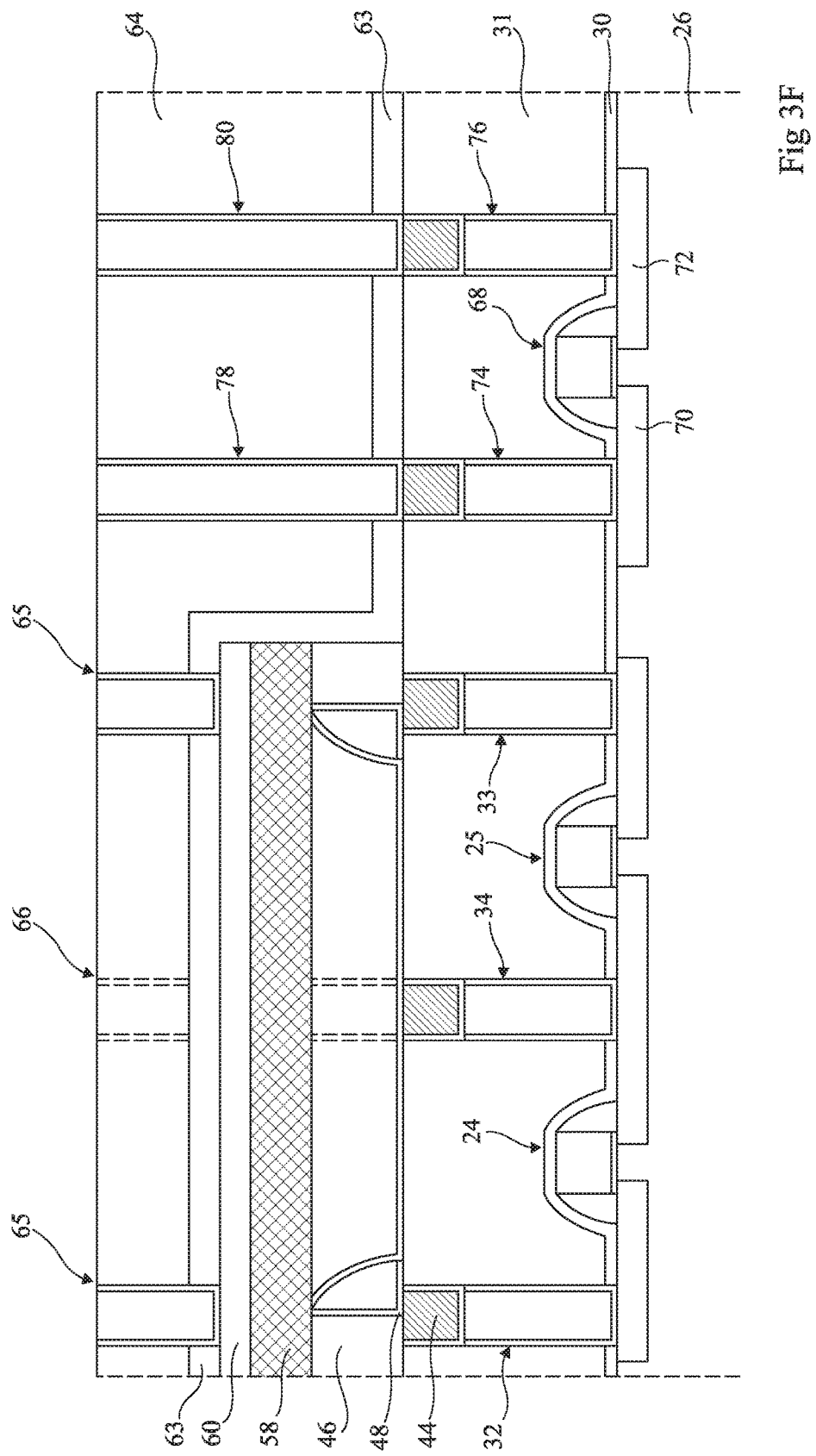

FIG. 3F illustrates, in its left-hand portion, the result of the next manufacturing steps, and, in its right-hand portion, a logic cell formed during the PCM cell manufacturing method.

An etch stop dielectric layer 63, as well as a dielectric layer 64, are preferably deposited over the entire structure. The last layer is then planarized, for example by CMP.

In the left-hand portion of the drawing, two vias 65 cross dielectric 64 and dielectric 63 to reach electrode 60 opposite vias 32 and 33. A via 66, shown in dotted lines, reaches the elongated strip forming central via 34 at the back of the cross-section plane, as will be described in relation with FIG. 4.

As mentioned in relation with FIG. 3C, the absence of copper in the upper portion of via 34 during the etching of the resistive material would have caused the creation of a cavity in the upper portion of central via 34. This cavity would have been filled with dielectric at the step illustrated in FIG. 3D, making the contact between central via 34 and via 66 uncertain. The right-hand portion of FIG. 3F shows a logic cell formed during the steps illustrated in FIGS. 3A to 3E.

The logic cell comprises a transistor 68 having a drain 70 and a source 72. A via 74 is in contact with drain 70 and a via 76 is in contact with source 72 of transistor 68. Vias 74 and 76 cross dielectric 31. They are formed of a lower portion made of the first metal and of an upper portion made of the second metal. The elements have been formed during the manufacturing steps described in relation with FIGS. 3A and 3B. As a variation, the right-hand portion of FIG. 3F, showing the logic cell, may be masked during the operation of forming cavities 40, at the step illustrated in FIG. 3A in such a way that after the step illustrated in FIG. 3E, vias 74 and 76 do not have an upper portion made of the second metal, as illustrated in FIG. 3F, but are totally made of the first metal.

The right-hand portion may be protected during steps illustrated in FIGS. 3C to 3E to avoid the deposition of layers of materials. As a variation, the layers of materials deposited during these steps may be removed before depositing dielectric layer 63. The same is true for the surfaces separating the PCM cell from other components.

Two vias 78 and 80 cross dielectric layers 63 and 64 and reach the upper ends of vias 74 and 76.

In the assembly of FIGS. 3A to 3F, the transistors comprise, in addition to the drain and/or source contacts formed by vias 32, 33, 34, 74, and 76, gate contacts which are not shown.

Figure 4:
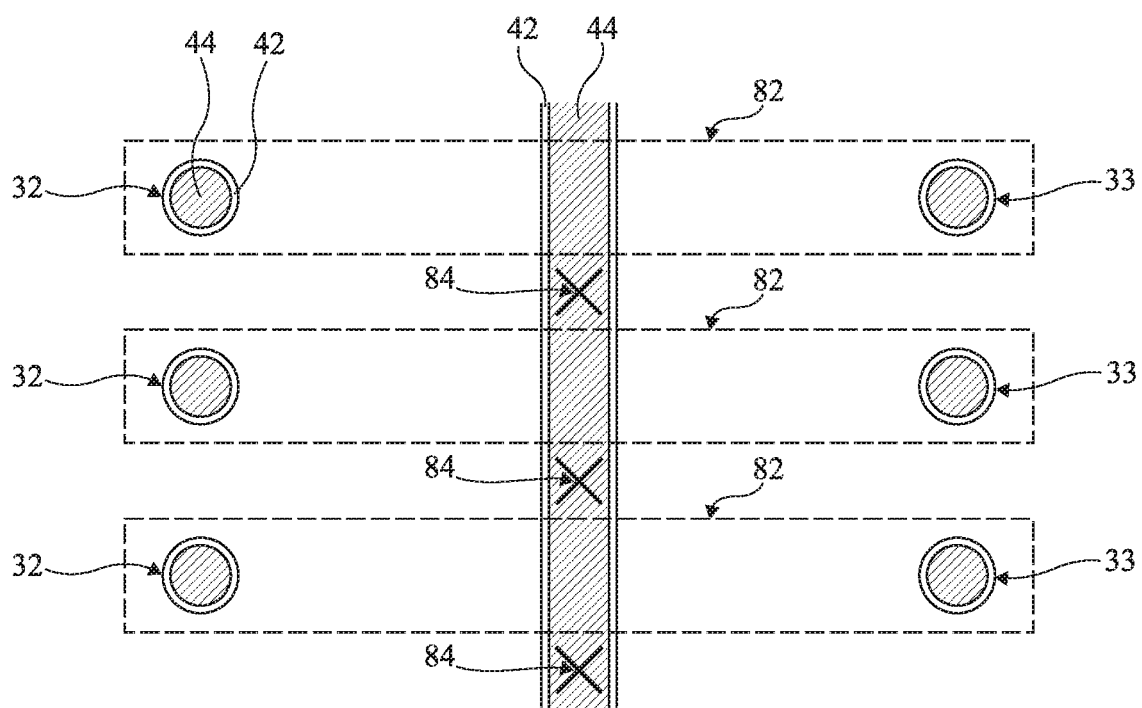
FIG. 4 is a top view of an embodiment at the step illustrated in FIG. 3B.

FIG. 4 is a top view of an embodiment of a portion of a phase-change memory at the manufacturing step described in FIG. 3B. A plurality of pairs of PCM cells such as previously described are formed on either side of a central via 34 in the shape of an elongated strip. The forming of a single central via 34, common to all the aligned PCM cells, enables to make the memory cells closer to one another and thus to increase the density of memory cells. In this layout, vias 32 and 33 form parallel rows of vias. The upper ends of vias 32, 33, and 34 formed of conductive layer 42 and of copper 44, are shown.

Areas 82, delimited by dotted lines, show the locations where the layers of phase-change material will be located. Crosses 84 show the locations where vias 66, described in relation with FIG. 3F, come into contact with the via in the shape of an elongated conductive strip 34.

Specific embodiments have been described. Various alterations, modifications, and improvements will occur to those skilled in the art. In particular the copper may be replaced with any other conductive material which can be selectively etched over the resistive material. Similarly, the tungsten may be replaced with any equivalent material. Similarly, all the described materials may be replaced with materials having the same functions.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing a phase-change memory, comprising:

forming in a first dielectric layer a first row of first conductive vias, a second row of second conductive vias and a central conductive via formed by an elongated conductive strip that extends parallel to the first and second rows and is positioned between the first and second rows, the first and second conductive vias and the central conductive via all being made of a first metal material;

removing the first metal from an upper portion of each of the first conductive via, the second conductive via and the central conductive via to form corresponding via openings;

filling each of the via openings with a second metal material different from the first metal material;

forming a second dielectric layer;

etching in the second dielectric layer a cavity that extends from the first row to the second row, said cavity at least partially exposing an upper end of the second metal material for each of the first conductive via and second conductive vias and exposing an upper end of the second metal material for the central conductive via;

depositing a layer of resistive material;

removing a portion of the layer of resistive material over the upper end of the second metal material for the central conductive via so as to leave in place other portions of the layer of resistive material, said other portions being in contact with the upper ends of the second metal material of the first conductive via and second conductive via and extending along a sidewall of the cavity;

filling the cavity with a third dielectric layer; and depositing a layer of phase-change material that is in contact with upper ends of the other portions of the layer of resistive material extending along the sidewall of the cavity.

2. The method of claim 1, further comprising removing the second dielectric layer, the layer of resistive material, the third dielectric layer and the layer of phase-change material above the first dielectric layer outside of an area which includes the first and second rows and a region between the first and second rows.

3. The method of claim 1, further comprising depositing a conductive layer on the layer of phase-change material.

4. The method of claim 3, further comprising:

forming first and second electrodes in contact with the conductive layer opposite each of the first and second conductive vias, respectively; and forming a third electrode in contact with the central conductive via.

5. A method of manufacturing a phase-change memory, comprising:
   forming a first dielectric layer over a semiconductor substrate including a source region and a drain region of a memory transistor;
   forming a first opening extending through the first dielectric layer to expose the source region;
   forming a second opening extending through the first dielectric layer to expose the drain region;
   depositing a first metal material to completely fill both the first and second openings;
   removing a top portion of the first metal material from both the first and second openings to produce corresponding third and fourth openings;
   depositing a second metal material different from the first metal material to completely fill both the third and fourth and second openings;
   providing a resistive component over and in contact with the second metal material in the third opening;
   providing a phase-change material over and in contact with the resistive component;
   forming a first electrical connection to the phase-change material; and
   forming a second electrical connection to the second metal material in the fourth opening, wherein providing the resistive component comprises:
      forming a second dielectric layer over the first dielectric layer;
      etching a cavity in the second dielectric layer that at least partially exposes an upper end of the second metal material in each of the third and fourth openings;
      depositing a layer of resistive material in the cavity; and
      removing a portion of the layer of resistive material over the fourth opening so as to leave in place the layer of resistive material over the third opening to provide said resistive component.

6. The method of claim 5, wherein the layer of resistive material that is left in place extends along a sidewall of the cavity.

7. The method of claim 6, further comprising:
   filling the cavity with a third dielectric layer; and
   depositing the phase-change material over the third dielectric layer with the deposited phase-change material in contact with and end of the layer of resistive material along the sidewall of the cavity.

8. The method of claim 5, further comprising:
   filling the cavity with a third dielectric layer; and
   depositing the phase-change material over the third dielectric layer.

9. The method of claim 8, wherein forming the first electrical connection to the phase-change material comprises depositing a layer of conductive material over the phase-change material.

10. The method of claim 8, wherein forming the second electrical connection comprising forming an opening extending through the third dielectric layer and filling that opening with conductive material.

* * * * *